US008503965B2

(12) United States Patent
 Buer

(10) Patent No.: US 8,503,965 B2
(45) Date of Patent: Aug. 6, 2013

(54) PROGRAMMABLE RF ARRAY

(75) Inventor: Kenneth V. Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 397 days.

(21) Appl. No.: 12/917,325

(22) Filed: Nov. 1, 2010

(65) Prior Publication Data

US 2011/0102074 A1 May 5, 2011

Related U.S. Application Data

(60) Provisional application No. 61/257,642, filed on Nov. 3, 2009.

(51) Int. Cl.
*H04B 1/28* (2006.01)
*H04B 1/16* (2006.01)
*H04B 1/40* (2006.01)

(52) U.S. Cl.
USPC .............................. 455/333; 455/340; 455/76

(58) Field of Classification Search
USPC ............ 455/73, 76, 103, 333, 313, 315, 318, 455/323, 334, 338, 340
See application file for complete search history.

(56) References Cited

U.S. PATENT DOCUMENTS 6,693,980 B1  2/2004  Linder et al.
2005/0227627 A1*  10/2005  Cyr et al. .................... 455/67.11
2006/0281429 A1  12/2006  Kishi et al.
2007/0149143 A1  6/2007  Kim et al.
2008/0252521 A1*  10/2008  Sabet et al. .................... 342/368
2009/0273517 A1*  11/2009  Thiesen et al. ................ 342/372
2011/0013677 A1*  1/2011  Ibrahim et al. ................ 375/219
2012/0184229 A1*  7/2012  Corman et al. ............. 455/127.2

FOREIGN PATENT DOCUMENTS

KR  10-2009-0046239 A2  5/2009

OTHER PUBLICATIONS

International Preliminary Report on Patentability dated May 18, 2012 in Application No. PCT/US2010/054997.
International Search Report and Written Opinion, International Application No. PCT/US2010/054997, dated Jul. 18, 2011.

* cited by examiner

*Primary Examiner* — Nguyen Vo
(74) *Attorney, Agent, or Firm* — Snell & Wilmer L.L.P.

(57) ABSTRACT

The present disclosure relates to radio frequency integrated circuits. More particularly, systems, devices and methods related to field programmable, software implemented, radio frequency integrated circuits are disclosed. In accordance with an exemplary embodiment, a field programmable, software implemented, radio frequency integrated circuit may comprise a high frequency IF embodiment. An input signal may be up converted to a high frequency, such as 60 GHz. Next, the amplitude and/or phase may be adjusted as desired. Subsequently, the signal may be down converted.

21 Claims, 4 Drawing Sheets

PROGRAMMABLE RF ARRAY

CROSS REFERENCE TO RELATED APPLICATIONS

This application is a non-provisional of U.S. Provisional Application No. 61/257,642, entitled "PROGRAMMABLE RF ARRAY," which was filed on Nov. 3, 2009. All of the contents of the previously identified application are hereby incorporated by reference for any purpose in their entirety.

FIELD OF INVENTION

The present invention relates to radio frequency integrated circuits. More particularly, the invention relates to systems, devices and methods related to field programmable, software implemented, radio frequency integrated circuits.

BACKGROUND OF THE INVENTION

Radio frequency integrated circuits (herein after RF circuit(s)) design and implementation often results in a long development schedule, high non-reoccurring engineering cost, high engineering costs, high failure rates and low flexibility. Such RF circuits are generally designed, fabricated and tested, often resulting in a process that can span a period of months, such as 18-24 months.

Conventional approaches to address this hurdle include the use of MEMS switches to change amplifier matching for programmable operating frequency bands. Similar conventional approaches provide diode switches or FET switches to provide tunable amplifiers or filters. Switch matrix technology has also been attempted with limited success. All of these aforementioned approaches suffer from various shortcomings. For instance, the switched approach would likely require the various RF functional blocks to operate over very broad bandwidths, or be returned over very broad bandwidths using switches (resulting in poor performance) or switch between numerous narrow band blocks. This becomes very inefficient use of circuit space.

Alternatively, other approaches to address these concerns include using a single wafer mask interconnect layer to connect various circuit functions or individual devices. This approach allows wafers to be particularly processed leaving the final layer or final few layers to be customized. This greatly reduces the design cycle time for development and fabrication. However, this approach still ultimately involves final design at the fabrication level and thus still involves some design and fabrication time. Moreover, the circuit architecture is in a fixed state with fixed circuit properties post fabrication.

Thus, it is desirable to have an RF integrated circuit that overcomes some of these drawbacks. It is further desirable to have a low cost, flexible solution with a range of RF functionality.

SUMMARY OF THE INVENTION

In one exemplary embodiment, a field programmable, software implemented, radio frequency integrated circuit is provided that has a range of RF functionality. For instance, in one exemplary embodiment, the field programmable RF array includes a first mixer configured to: (1) receive an input signal and (2) to receive reference signal sent through a first oscillator, a second mixer for up converting the converted input signal from the first mixer to a high frequency signal; a DAC, and a third mixer configured to (1) receive the signal from the DAC, (2) receive a reference signal sent through an oscillator and down convert the altered signal to a desired output frequency. The DAC may be configured to control a phase shifter, and/or an amplifier configured to alter the input signal.

In one exemplary embodiment, a method includes, upconverting an input signal frequency to a high frequency, adjusting the amplitude, adjusting the phase; and down-converting the signal to a selected output frequency. The upconverting, adjusting the amplitude, adjusting the phase, and down converting steps are all executed on a field programmable RF array under control of an onboard controller. One or more of these functions may be produced by an integrated circuit housed on a single field programmable semiconductor chip.

In one exemplary embodiment, a field programmable RF array includes an input configured to receive an input signal; field programmable components configured to perform treatment and/or adjust at least one of the frequency, amplitude, and phase of the input signal; and an output configured to output the treated input signal.

BRIEF DESCRIPTION OF THE DRAWINGS

A more complete understanding of the present invention may be derived by referring to the detailed description and claims when considered in connection with the drawing figures, wherein like reference numbers refer to similar elements throughout the drawing figures, and:

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
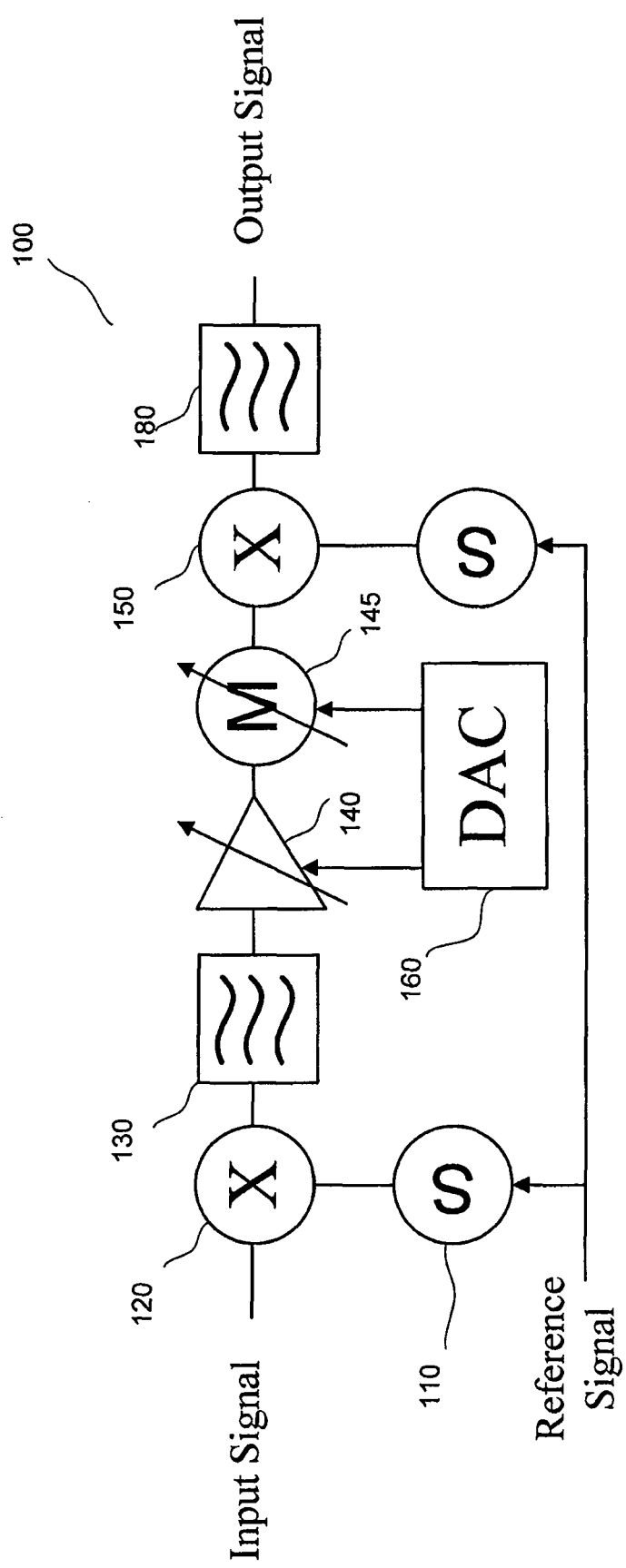
FIG. 1 illustrates an exemplary embodiment of the present disclosure.

In accordance with an exemplary embodiment of the present invention, with reference to FIG. 1, a field programmable, software implemented, radio frequency integrated circuit 100 may comprise a high frequency IF embodiment. An input signal is up converted to a high frequency, such as 60 GHz. Next, the amplitude and/or phase are adjusted as desired. Next, the signal is down converted. In an exemplary embodiment, when the signal is down converted, it is down converted to comprise one or more of: the same output frequency as the frequency prior to the initial up conversion and/or a different output frequency if end-to-end frequency conversion is desired. In this embodiment, the LO frequencies can be selected to minimize spurious signals and take advantage of the fixed filter responses.

Multiple similar channels may be included on the same chip. These multiple channels may be implemented with an RF switch matrix.

Figure 2:
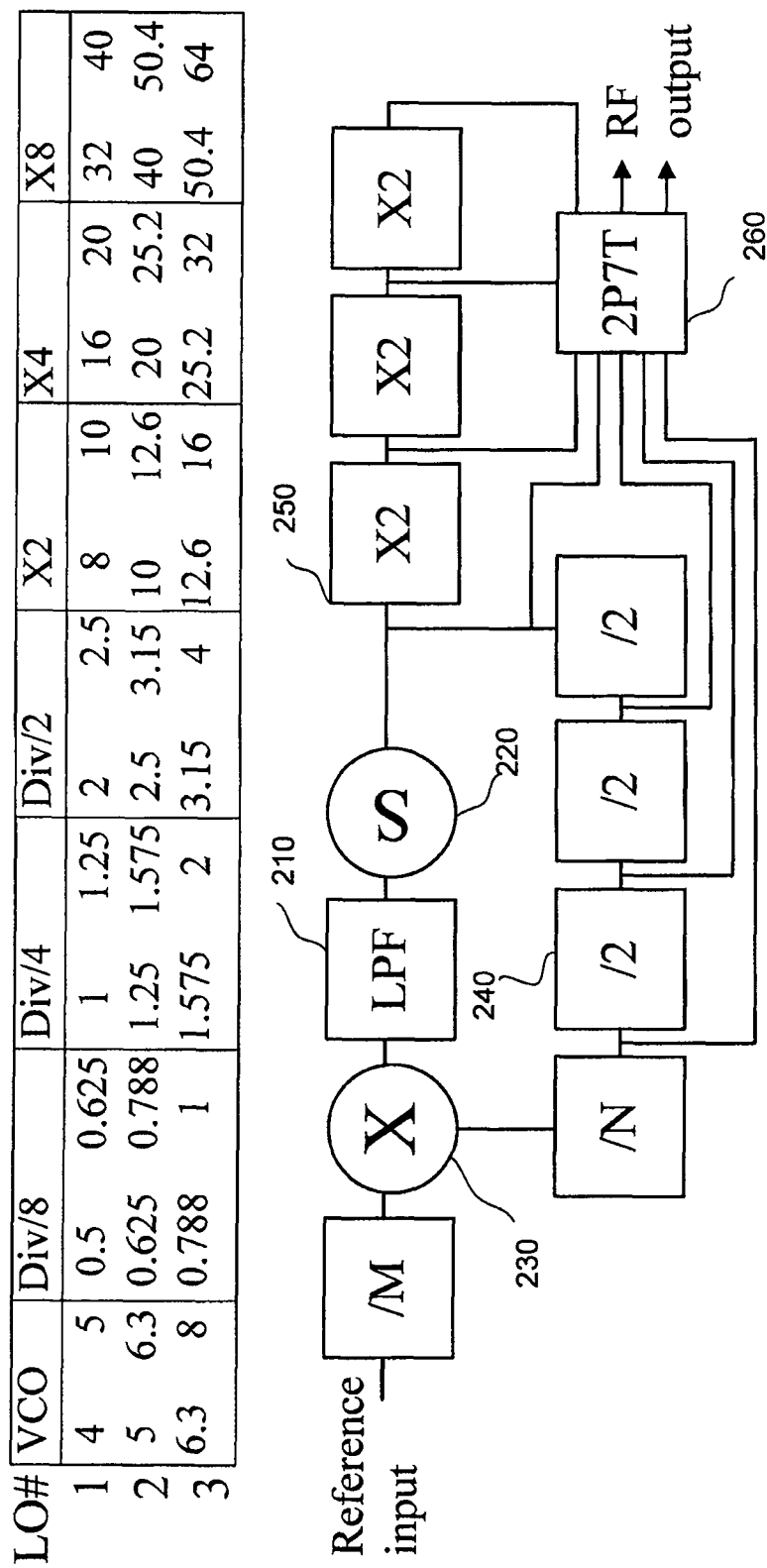
FIG. 2 illustrates an exemplary embodiment of the LO generation in accordance with the present disclosure.

As seen in FIG. 1, the field programmable, software implemented, radio frequency integrated circuit may receive an input signal (and a reference signal sent through a first oscillator 110) sent to a first mixer 120. A mixer may be a device that takes a baseband input signal and outputs a radio frequency-modulated signal. This RF signal is then up converted to a high frequency signal and altered according to software implemented programming. The software may actuate phase shifter(s) 145, and/or amplifier(s) 140 as desired. The altered signal (and a reference signal sent through an oscillator) is delivered to another mixer 150 and down converted to a desired frequency. In one embodiment, the first and second oscillators may be the same oscillator or different oscillators. Additional oscillators may be implemented as needed. Additionally, one or more filters 130, 180 may be coupled to the system. The device may be coupled to an input for the receiving of instructions and/or programming. With reference to FIG. 2, the device may also be coupled to multiple phase locked loop (PLL) circuits. Additionally, the amplitude and phase adjustment circuit (i.e. tunable amplifier 140 and/or phase shifter 145) may be implemented as a vector modulator.

With reference again to FIG. 1, a digital to analog converter (DAC) 160 may be coupled to the field programmable, software implemented, radio frequency integrated circuit. In general a DAC converts an abstract finite-precision number (usually a fixed-point binary number) into a concrete physical quantity (e.g., a voltage or a current). In particular, DACs are often used to convert finite-precision time series data to a continually-varying physical signal. A typical DAC converts the abstract numbers into a concrete sequence of impulses that are then processed by a reconstruction filter using some form of interpolation to fill in data between the impulses. Other DAC methods (e.g., methods based on Delta-sigma modulation) produce a pulse-density modulated signal that can then be filtered in a similar way to produce a smoothly-varying signal. In an exemplary embodiment, the circuit arrangement is configured using a DAC. In various exemplary embodiments, the DAC may be varied dynamically and/or used for modulation.

Resolution, maximum sampling frequency, monotonicity, THD+N, dynamic range phase distortion and/or sampling period instability, may be a design factor for some embodiments. Additionally, static performance, differential non-linearity (DNL), integral non-linearity (INL), gain, offset, noise, frequency domain performance, spurious-free dynamic range (SFDR), signal to noise and distortion ratio (SNDR), i-th harmonic distortion (HDi), total harmonic distortion (THD), time domain performance, glitch energy, response uncertainty, and/or time non-linearity (TNL) may be design concerns and/or constraints.

In an exemplary embodiment, the device is coupled to a memory. The memory may include pre-stored instructions and/or programmable computer programming. In another exemplary embodiment the device is coupled to an input. This input may be wireless or wired, and/or include a port for downloading instructions and/or programming, such as via a flash memory port.

In accordance with an exemplary embodiment of the present invention, a field programmable, software implemented, radio frequency integrated circuit may comprise a broadband vector modulator. In this embodiment, phase and amplitude of a signal may be altered as desired.

In some exemplary embodiments, implementations of the field programmable, software implemented, radio frequency integrated circuit would otherwise require custom monolithic microwave integrated circuit (MMIC) development.

Various implementations of the field programmable, software implemented, radio frequency integrated circuit may comprise a Silicon ("Si") or Silicon Germanium ("SiGe") substrate, or any other substrate that permits or may permit integration of microwave and digital components on a single chip. Also, various implementations of the field programmable, software implemented, radio frequency integrated circuit may utilize SiGe BiCMOS technology. Among other attributes, this may allow for high levels of integration of RF and digital functions. For instance, SiGe bipolar devices generally have low phase noise and good high frequency performance. CMOS devices provide logic functions for efficient digital functionality and mixed signal control functions. These CMOS devices may include DAC, ADC, control registers for switches, attenuators and phase shifters.

In accordance with an exemplary embodiment, the field programmable, software implemented, radio frequency integrated circuit is programably changeable to function as one or more or multiples of a switch, phase shifter, digital attenuator, RF amplifier, voltage controlled oscillator (VCO), PLL, mixer, linearizer and/or frequency multiplier. Thus, a designer may utilize this off the shelf (post manufacture) solution in place of creating a custom device with one or more of the aforementioned functions. As a designers needs change, they may quickly alter the functionalities of their finished product by altering the functionality of the device. In some embodiments, these changes may be done pre-installation of the device and in other embodiments these changes may be performed after the device has been installed. Like many of the advances provided by the FPGAs, this technology results in quick development cycle time, very low non-reoccurring engineering costs and is well suited for short manufacturing runs. Embodiments of this disclosure reduce engineering costs, and schedule while maintaining reasonable recurring costs. Various implementations of the field programmable, software implemented, radio frequency integrated circuit may be implemented as a prototyping platform, a short term solution, and/or as a long term production product.

Various implementations of the field programmable, software implemented, radio frequency integrated circuit may comprise a family of programmable RF arrays with different functional features including but not limited to switches, phase shifters, digital attenuators, RF amplifiers, VCOs, PLLs, mixers and/or frequency multipliers. Additionally, various implementations of the field programmable, software implemented, radio frequency integrated circuit may function for up-conversion, such as through an I/Q modulator. In another exemplary embodiment the field programmable, software implemented, radio frequency integrated circuit may function for down-conversion; such as I/Q down-conversion and/or image reject down-conversion. In various embodiments, the field programmable, software implemented, radio frequency integrated circuit may function as a switch matrix. In various embodiments, the field programmable, software implemented, radio frequency integrated circuit may function as a linearizer, such as to correct distortion (e.g. amplifier distortion). In another exemplary embodiment, the field programmable, software implemented, radio frequency integrated circuit may function as a phase shifter. In various embodiments, the field programmable, software implemented, radio frequency integrated circuit may function as a variable gain amplifier (VGA). In various exemplary embodiments, the field programmable, software implemented, radio frequency integrated circuit may function as a detector. In various exemplary embodiments, the field programmable, software implemented, radio frequency integrated circuit may function as a frequency multiplier. In an alternative exemplary embodiments, the field programmable, software implemented, radio frequency integrated circuit may function as a phase locked oscillator. It should be noted in various embodiments, the field programmable, software implemented, radio frequency integrated circuit may function as one or more of the previous functional configurations simultaneously. Additionally, an alternative embodiment that may be used separately or in conjunction with the previous embodiments is as a wide band vector generator circuit which may provide similar functionality on the amplitude and phase of the incoming signal but without any frequency conversion.

With reference to FIG. 2, in an exemplary embodiment, the device may comprise one or more different PLL circuits for local oscillator (LO) generation. In an exemplary embodiment, these circuits will comprise similar percentage tuning bandwidth. For example, in an embodiment utilizing one or more, such as three, PLL's, a configuration may be LO1=approximately 4.0-5.0 GHz; LO2=approximately 5.0-6.3 GHz, LO3=approximately 6.3-8.0 GHz. Thus, any frequency between about 0.5-64 GHz may be achieved by selecting the correct PLL. By selecting any one of the three LO's primary output frequencies between about 4-8 GHz can be generated. In one exemplary embodiment, these LO's are phase locked integrated SiGe LO's. A filter, such as a low pass filter (LPF) 210 may be coupled to an output of the mixer 230. The filer may be coupled to an input of an oscillator 220. The SiGe LO may contain one or more frequency dividers 240 which may be used to generate a desired frequency or frequencies, such as 0.5-4GHz. Similarly, multiples of the oscillators can be created by selecting outputs of the frequency multipliers 250 following the oscillator(s) 220. With reference to FIG. 2, a switch 260 capable of selecting between the fundamental oscillator output and various divider 240 or frequency multiplier 250 outputs is depicted.

Generally, a phase-locked loop or phase lock loop is a control system that generates a signal that has a fixed relation to the phase of a "reference" signal. A phase-locked loop circuit responds to both the frequency and the phase of the input signals, automatically raising or lowering the frequency of a controlled oscillator until it is matched to the reference in both frequency and phase. A phase-locked loop may be an example of a control system using negative feedback. PLLs may generate stable frequencies, recover a signal from a noisy communication channel, or distribute clock timing pulses in digital logic designs such as microprocessors.

In another exemplary embodiment, additional PLLs are added, such as a fourth or more PLL(s) to expand tuning ranges to achieve overlap. Alternatively, in another exemplary embodiment, fewer PLLs are incorporated if wider tuning ranges are desired. In general, phase noise may be a function of tuning range. One may design the device to cover the frequencies of interest and still have phase noise within compliance with government and industry standards, for example phase noise requirements for satellite communications.

Exemplary embodiments of this disclosure may not comprise optimal output power level and noise performance, but advances in semiconductor technology may improve these performance characteristics. Silicon Germanium (SiGe) is a silicon semiconductor process that combines standard CMOS logic with SiGe heterojunction bipolar HBT devices. SiGe heterojunction bipolar HBT devices may yield excellent high frequency RF performance. SiGe is a general term for the alloy $Si_{1-x}Ge_x$ which consists of any molar ratio of silicon and germanium. It is commonly used as a semiconductor material in integrated circuits (ICs) for heterojunction bipolar transistors or as a strain-inducing layer for CMOS transistors. This relatively new technology offers opportunities in mixed-signal circuit and analog circuit IC design and manufacture. Heterojunction bipolar transistors have higher forward gain and lower reverse gain than traditional homojunction bipolar transistors. This translates into better low current and high frequency performance. Being a heterojunction technology with an adjustable band gap, SiGe may offer the opportunity for more flexible band gap tuning than silicon-only technology.

Silicon Germanium-on-insulator (SGOI) is a technology analogous to the Silicon-On-Insulator (SOI) technology currently employed in computer chips. SGOI increases the speed of the transistors inside microchips by straining the crystal lattice under the MOS transistor gate, resulting in improved electron mobility and higher drive currents. SiGe MOSFETs can also provide lower junction leakage due to the lower band gap value of SiGe.

In various exemplary embodiments, because the designs are not pushing the limits of the tolerances of the SiGe material, the field programmable, software implemented, radio frequency integrated circuit will be less likely to have products that fail testing, thus reducing the reject rate as compared to custom fabrications. Unlike EPROM-based firmware which can be erased and reprogrammed, but only after lengthy exposure to a high-intensity ultraviolet light source, the programmable RF array may be reprogrammed without being exposed to a high-intensity ultraviolet light source. In an exemplary embodiment, the programmable RF array is field programmable i.e. the programmable RF array is configured to facilitate replacing a first code with new code that can modify or extend the programmable RF array's capabilities post manufacture.

In one embodiment, the field programmable, software implemented, radio frequency integrated circuit does not require final design at the fabrication level. Thus, the circuit architecture of the field programmable, software implemented, radio frequency integrated circuit may not be in a fixed state with fixed circuit properties post fabrication. In some embodiments, the field programmable, software implemented, radio frequency integrated circuit does not require RF functional blocks to operate over broad bandwidths, or to be returned over broad bandwidths using switches or switch between numerous narrow band blocks.

Figure 3:
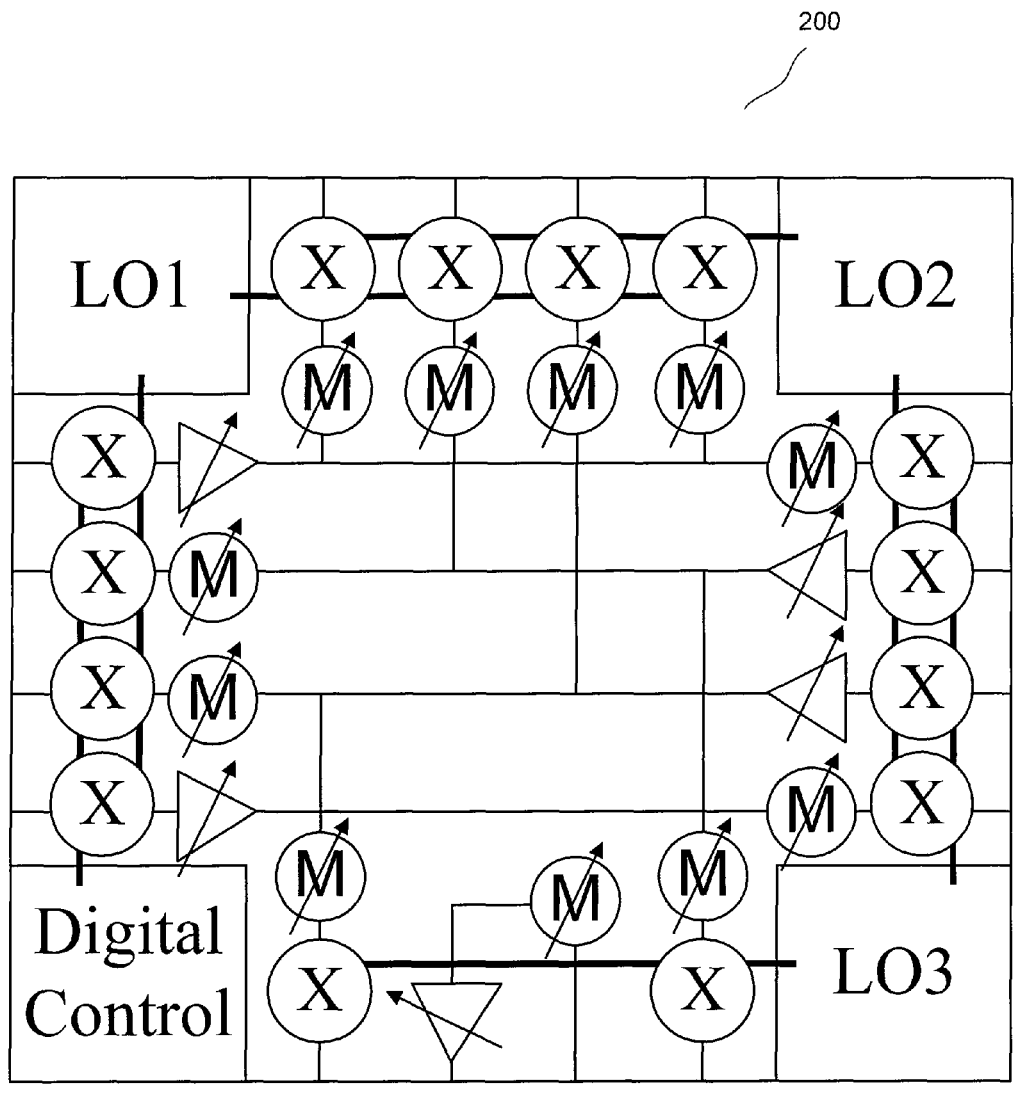
FIG. 3 illustrates a chip architecture in accordance with exemplary embodiment 200 of the present disclosure.
Figure 4:
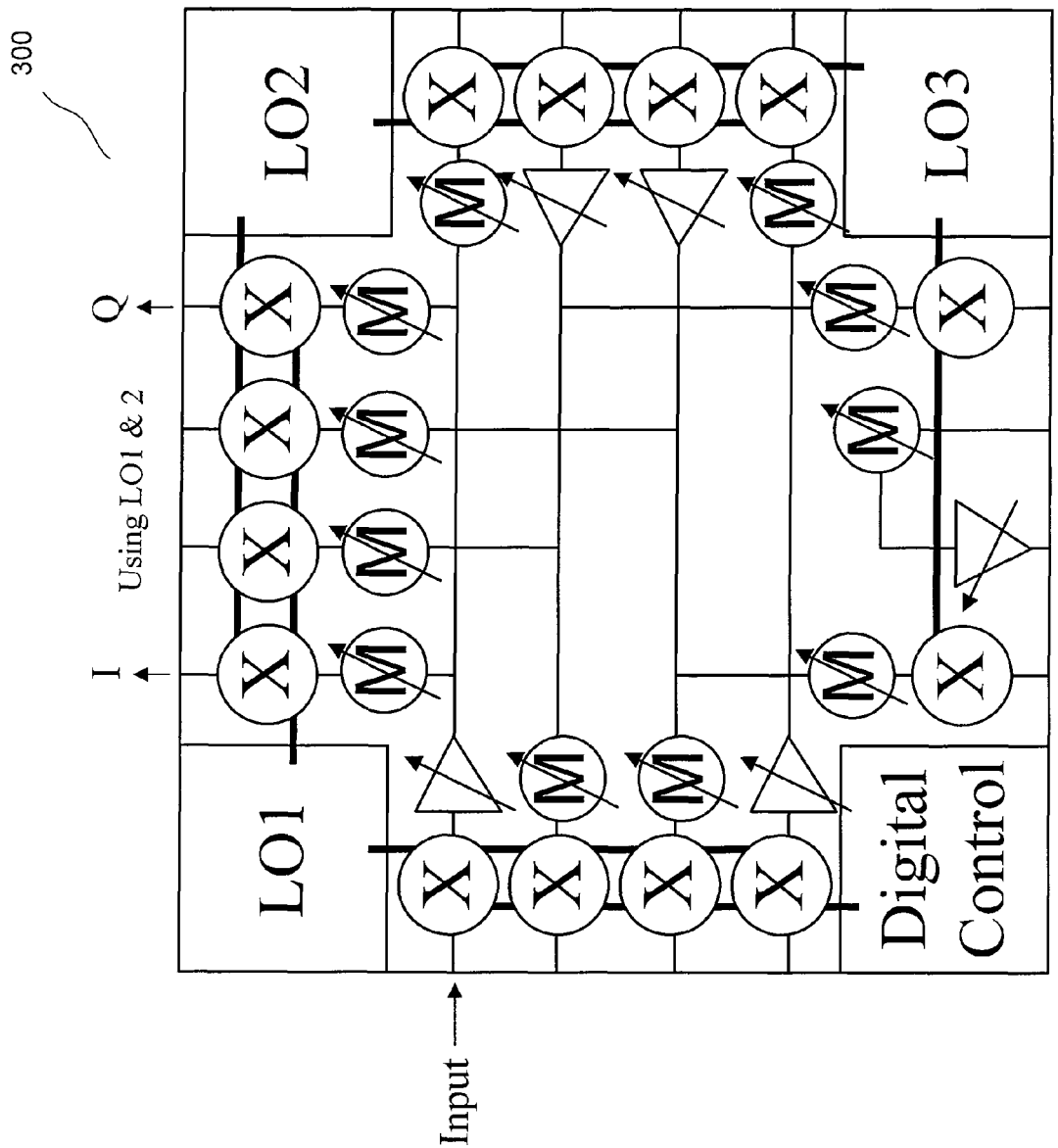
FIG. 4 illustrates the chip architecture of FIG. 3 programmed to perform an I/Q down-converter function in accordance with exemplary embodiment 300 of the present disclosure.

In one exemplary embodiment, a field programmable RF array includes an input configured to receive an input signal; field programmable components configured to perform treatment (e.g. adjust at least one of the frequency, amplitude, and phase) of the input signal; and an output configured to output the treated input signal. In various embodiments the field programmable components to perform treatment and/or adjustment of at least one of the phase, amplitude, and/or frequency of the input signal include: a first mixer configured to receive an input signal and to receive reference signal sent through a first oscillator; a second mixer for up converting the converted input signal from the first mixer to a high frequency signal; a DAC; a phase shifter; an amplifier (or a vector modulator); a third mixer configured to receive the signal from the DAC, and receive a reference signal sent through an oscillator and down convert the altered signal to a desired output frequency. The field programmable RF array may be housed on a single semiconductor chip. The function of the field programmable RF array may be modified without disassembling the device or returning it to a manufacturer. Also, the function of the field programmable RF array may be reprogrammed with new code that can modify or extend the programmable RF array's capabilities post manufacture. Multiple replicates (as seen in FIGS. 3 and 4) of the base circuitry may be housed on the same single semiconductor chip, wherein the multiple replicates of the base circuitry may provide a plurality of functionality such as up-conversion, down-conversion, switch matrix, phase shift, VGA, linearizer, detector, frequency multiplier, wide band vector generator circuit, and/or phase locked oscillator.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

We claim:

1. A method comprising:
upconverting an input signal frequency to a high frequency;
adjusting an amplitude of the upconverted input signal;
adjusting a phase of the upconverted input signal; and
downconverting the upconverting input signal to a selected output frequency; wherein the upconverting, adjusting the amplitude, adjusting the phase, and down converting steps are all executed on a field programmable RF array under control of an onboard controller.

2. The method of claim 1, further comprising:
matching an output frequency of the downconverted signal to the input signal frequency.

3. The method of claim 1, wherein the method is configured to produce one or more Of the following functionalities: up-conversion, down-conversion, switch matrix, phase shift, VGA, detector, linearizer, frequency multiplier, wide band vector generator circuit, and phase locked oscillator.

4. The method of claim 1, further comprising:
selecting the output frequency to be lower than the input signal frequency.

5. The method of claim 1, further comprising:
selecting the output frequency to be higher than the input signal frequency.

6. The method of claim 1, further wherein adjusting the amplitude of the upconverted input signal further comprises one or more of increasing the amplitude of the upconverted input signal, decreasing the amplitude of the upconverted input signal and holding the amplitude of the upconverted input signal at the same level as the input signal.

7. The method of claim 1, wherein adjusting the phase of the upconverted input signal further comprises adjusting the phase of the upconverted input signal to one of phase-lag the input signal, phase-lead the input signal, and be equal to the input signal.

8. The method of claim 1, wherein the method is configured to produce one or more of the following functions: RF amplifier, VCO, PLL, mixer, distorter of frequency, distorter of phase, frequency multiplier, switch, phase shifter, and digital attenuator.

9. A field programmable RF array comprising:
a first mixer configured to: (1) receive an input signal and (2) to receive a first reference signal sent through a first oscillator;
a second mixer for up converting the converted input signal from the first mixer to a high frequency signal;
a DAC used to configure at least one of the following:
a phase shifter, and an amplifier configured to alter the high frequency signal; and
a third mixer configured to (1) receive the high frequency signal from the DAC, and (2) receive a second reference signal sent through an oscillator and down convert the altered signal to a desired output frequency of the field programmable RF array.

10. The field programmable RF array of claim 9, wherein the output frequency is matched to an input signal frequency.

11. The field programmable RF array of claim 9, wherein the output frequency is less than an input signal frequency.

12. The field programmable RF array of claim 9, wherein the output frequency is more than an input signal frequency.

13. The field programmable RF array claim 9, wherein the field programmable RF array is configured to produce one or more of the following functionalities: up-conversion, down-conversion, switch matrix, phase shift, VGA, linearizer, detector, frequency multiplier, wide band vector generator circuit, and phase locked oscillator.

14. The field programmable RF array of claim 9, wherein the amplifier is configured to adjust an amplitude of the high frequency signal, wherein adjusting the amplitude further comprises one or more of increasing the amplitude, of the high frequency signal, decreasing the amplitude of the high frequency signal and holding the amplitude of the high frequency signal at the same level as the input signal.

15. The field programmable RF array of claim 9, wherein the phase shifter is configured to adjust a phase of the high frequency signal, wherein adjusting the phase further comprises adjusting the phase to one of phase-lag the input signal, phase-lead the input signal, and be equal to the input signal.

16. The field programmable RF array of claim 9, wherein the field programmable RF array is configured to produce one or more of the following functions: RF amplifier, VCO, PLL, mixer, frequency multiplier, switch, phase shifter, and digital attenuator.

17. A field programmable RF array comprising:
an input configured to receive an input signal;
a first mixer for upconverting the input signal to an up-converted frequency;
field programmable components of the field programmable RF array configured to selectably adjust amplitude and phase of the up-converted input signal; and
a second mixer for down-converting the adjusted up-converted input signal to a selected output frequency, wherein the up-converting, the selectably adjusting the amplitude, the selectably adjusting the phase, and the down-converting are all executed on the field programmable RF array under control of an onboard controller.

18. The field programmable RF array of claim 17, wherein the field programmable RF array is housed on a single semiconductor chip.

19. The field programmable RF array of claim 17, wherein a function of the field programmable RF array may be modified without disassembling the field programmable RF array or returning it to a manufacturer.

20. The field programmable RF array of claim 17, wherein a function of the field programmable RF array may be reprogrammed with new code that can modify or extend the capabilities of the field programmable RF array post manufacture.

21. The field programmable RF array of claim 17, wherein multiple replicates of a base circuitry may be housed on a single semiconductor chip, wherein the multiple replicates of base circuitry of the field programmable RF array may provide a plurality of functionality.

* * * * *

UNITED STATES PATENT AND TRADEMARK OFFICE
CERTIFICATE OF CORRECTION

| | | |
|---|---|---|
| PATENT NO. | : 8,503,965 B2 | Page 1 of 1 |
| APPLICATION NO. | : 12/917325 | |
| DATED | : August 6, 2013 | |
| INVENTOR(S) | : Kenneth V. Buer | |

It is certified that error appears in the above-identified patent and that said Letters Patent is hereby corrected as shown below:

In the Claims

In Column 8 Line 24 Claim 14, after "amplitude" please delete ","

Signed and Sealed this
Seventeenth Day of September, 2013

Teresa Stanek Rea
*Deputy Director of the United States Patent and Trademark Office*